United States Patent [19]

Vollmer

[11] Patent Number: 4,677,394
[45] Date of Patent: Jun. 30, 1987

[54] METHOD AND APPARATUS FOR CALIBRATING AN ADJUSTABLE FREQUENCY GENERATOR

[75] Inventor: Hans-Ulrich Vollmer, Berlin, Fed. Rep. of Germany

[73] Assignee: Siemens Aktiengesellschaft, Berlin and Munich, Fed. Rep. of Germany

[21] Appl. No.: 887,280

[22] Filed: Jul. 21, 1986

[30] Foreign Application Priority Data

Jul. 19, 1985 [DE] Fed. Rep. of Germany ....... 3526363

[51] Int. Cl.$^4$ .......................... H03L 7/00; H03L 7/16
[52] U.S. Cl. ..................................... 331/1 A; 331/11; 331/16; 331/17; 331/25; 331/44; 331/14
[58] Field of Search ..................... 331/1 A, 10, 11, 16, 331/17, 25, 44, 14

[56] References Cited

U.S. PATENT DOCUMENTS

| | | | |
|---|---|---|---|
| 4,103,250 | 7/1978 | Jackson | 331/1 A |
| 4,511,858 | 4/1985 | Charavit et al. | 331/10 |
| 4,513,448 | 4/1985 | Maher | 331/19 X |
| 4,584,539 | 4/1986 | Stankey | 331/25 X |

FOREIGN PATENT DOCUMENTS 0041882 12/1981 European Pat. Off. .
2535545 5/1984 France .
2122822 1/1984 United Kingdom .

OTHER PUBLICATIONS

U. Tietze and Ch. Schenk, "Halbleiter-Schaltungstechnik", 4th ed., 1978, pp. 413, 440, 441 and 692.
Roland Best, "Theorie und Anwendungen des Phase-Locked Loops", 3rd ed., 1982, p. 16, last line.

*Primary Examiner*—Siegfried H. Grimm
*Attorney, Agent, or Firm*—Kenyon & Kenyon

[57] ABSTRACT

A method for calibrating an adjustable frequency generator having a voltage-controlled oscillator which is preceded by a computer via a digital-to-analog converter. The control input of the oscillator is coupled to a calibrating device comprising a series circuit comprising a digital phase detector and a lowpass filter forming a phase-locked loop circuit arrangement. By the computer, a digital-to-analog converter is caused, upon a frequency reference value signal, to deliver a control voltage to the oscillator which corresponds to the output voltage of the lowpass filter prior to the start of the calibrating process. A digital value corresponding to the control voltage is stored in the computer together with a digital reference value corresponding to the given frequency.

10 Claims, 3 Drawing Figures

METHOD AND APPARATUS FOR CALIBRATING AN ADJUSTABLE FREQUENCY GENERATOR

BACKGROUND OF THE INVENTION

Adjustable frequency generators having voltage-controlled oscillators are known. For instance, in the book by U. Tietze and Ch. Schenk "Halbleiter-Schaltungstechnik" (Semiconductor Circuit Technology), 4th ed., 1978, pages 440 and 441, a voltage-controlled oscillator is described, the output frequency of which is proportional to the input voltage. Not only this known voltage-controlled oscillator, but oscillators of this type generally have a nonlinear control characteristic; this means that the frequency changes nonlinearly with the input variable. It is therefore necessary to calibrate the voltage-controlled oscillators.

This also applies to an adjustable frequency generator such as is described in U.S. Pat. No. 4,103,250. This known frequency generator contains a voltage-controlled oscillator which is preceded via a digital-to-analog converter by a ROM which may be part of a computer. Upon the selection of a frequency, the oscillator is acted upon via the ROM, taking into consideration the nonlinear characteristic of the voltage-controlled oscillator by means of the subsequent digital-to-analog converter, by an input voltage such that it generates the selected frequency on the output side. By means of a RAM and an electronic supplemental device, the accuracy of the frequency generation can be improved.

SUMMARY OF THE INVENTION

It is an object of the present invention to provide a method and apparatus for calibrating such an adjustable frequency generator, i.e., a frequency generator wherein a computer precedes the voltage-controlled oscillator via a digital-to-analog converter.

The above and other objects of the present invention are achieved by a method for calibrating an adjustable frequency generator having a voltage-controlled oscillator coupled to a computer via a digital-to-analog converter, the oscillator further being coupled to a calibrating device comprising a digital phase detector and a lowpass filter forming a phase-locked loop circuit arrangement, an output of the oscillator being coupled to one input of the phase detector, and a further input of the phase detector being coupled to an adjustable frequency reference value setter of the calibrating device, said method comprising the steps of supplying digital reference value signals corresponding to different frequency reference value signals to the computer and to the further input of the phase detector, causing the digital-to-analog converter under control of the computer to deliver at its output a control voltage to an input of the oscillator after a steady state of the phase-locked loop circuit arrangement is reached for the respective frequency reference value signal, said control voltage corresponding to an output voltage of the low-pass filter prior to the beginning of the calibrating process, storing a digital value corresponding to the control voltage associated with the respective digital reference value signal in the computer, and disconnecting the input of the oscillator from the calibrating device.

A circuit arrangement for calibrating an adjustable frequency generator is also within the scope of the invention.

Through the use of the calibrating device, there is formed for every frequency set by means of the computer by the digital-to-analog converter, a control voltage which causes the voltage-controlled oscillator to deliver a signal with a defined output frequency, where this output frequency corresponds directly to the applicable frequency reference value due to the phase-locked loop circuit arrangement. By storing a digital value corresponding to the prevailing control voltage together with the digital reference value signal in the memory of the computer, it is then assured that, upon the selection of a desired frequency in the computer, the frequency generator according to the invention actually generates this frequency at the output of its voltage-controlled oscillator. This is accomplished without time delay, since there is no settling of the frequency generator according to the invention. Thus, the frequency generator according to the invention can advantageously operate in start-stop mode, i.e., produce an oscillation with a desired frequency and a defined starting condition at its output immediately upon a given command.

The cost for calibrating the frequency generator according to the invention is relatively small because commercially available phase-locked frequency generators can be used for the calibrating device, for instance, an adjustable phase-lock loop frequency generator such as is described in DE-OS No. 34 11 883. Also the phase-locked loop circuit arrangement is inexpensive. Regarding the time required for calibrating the frequency generator according to the invention, it should be said that the frequency generator according to the invention is particularly advantageous in this respect because after a definite frequency reference value is set by the calibrating device, obtaining the control voltage and storing the digital reference value signal and a digital value corresponding to the control voltage takes place automatically in the computer.

As far as the generation of the control voltage is concerned, the method according to the invention can evolve in different ways. Thus, it is considered advantageous if the output of the digital-to-analog converter is connected via an adding circuit to the input of the voltage-controlled oscillator, the output voltage of the lowpass is monitored for reaching the value zero and when the value zero is reached, a storing command for the respective digital reference value signal and the digital value corresponding to the control voltage is generated.

It may also be advantageous if, in a different embodiment of the method according to the invention, the output of the digital-to-analog converter is connected, via an adding circuit, to the input of the voltage-controlled oscillator and also to the output of a calibrating device having a phase detector with two outputs, the two output signals of which are examined for phase equality; if phase equality exists, a command to store for the digital frequency reference signal and the digital value corresponding to the control voltage is generated. With this arrangement, however, the low-pass must not have an integrating effect.

In a further advantageous form of the method according to the invention, the output of the digital-to-analog converter is connected to an unoccupied contact of a switch, the other, occupied contact of which connects the voltage-controlled oscillator to the lowpass; in the steady state, the output voltage of the digital-to-analog converter is compared with the output voltage of the lowpass and, if voltage equality exists, is recognized as the control voltage, and, if voltage equality exists, a command to store the digital reference value signal and the digital value corresponding to the control voltage is generated.

In its different embodiments, the method according to the invention can be carried out with accordingly differently designed circuit arrangements. Thus, it is considered as advantageous for carrying out the method with monitoring the output voltage of the lowpass for the value zero that the frequency reference value setter is connected to a control and a data bus of the computer and, has an output coupled to the further input of the phase detector; that a voltage monitoring circuit of the calibrating device is connected on the input side to the output of the lowpass and on the output side to the address and the data bus of the computer; and that the digital-to-analog converter is connected on the input side to the address and the data bus of the computer and on the output side, to the adding circuit. The voltage monitoring circuit can be realized as a so-called window comparator and thus be designed, for instance, as is described in the already mentioned book by Tietze/Schenk on page 413. With such a window comparator, not only the output voltage of the lowpass to the value zero can be monitored, but the sign can be determined at the same time.

For carrying out the method according to the invention having a calibrating device with a phase detector having two outputs, the frequency reference value setter is advantageously connected to an address and to a data bus of the computer and has an output connected to the further input of the phase detector; a digital pulse monitoring device of the calibrating device is connected on the output side to the address and the data bus of the computer; two inputs of the digital pulse monitoring device are coupled to the two outputs of the digital phase detector; the digital-to-analog converter is connected on the input side to the address and the data bus of the computer and on the output side to the adding circuit which can be connected via a switch also to the output of the lowpass. With this circuit arrangement, the calibration is therefore accomplished by a digital evaluation of the output pulses of the phase detector.

For carrying out the method according to the invention with a switch between the digital-to-analog converter and the voltage-controlled oscillator, the frequency reference value setter is advantageously connected to an address and a data bus of the computer and its output is coupled to the further input of the phase detector; the digital-to-analog converter is connected on the input side to the address and the data bus of the computer and on the output side via the switch to the input of the oscillator following the calibration device; a comparator of the calibration device is connected on the input side to the output of the digital-to-analog converter as well as to the output of the lowpass and on the output side to the address and data bus of the computer. A substantial advantage of this circuit arrangement is that during the individual calibrating operation with an accompanying change of the control voltage, the phase-locked loop circuit arrangement is not influenced, so that another settling of this arrangement does not occur and does not have to be waited for during the calibration.

The circuit arrangements according to the invention are distinguished by the advantageous property that they can be employed as a frequency generator in start-stop operation and thus can generate a signal with the desired frequency and a defined starting condition (for instance, zero crossing) at its output, without time delay by transients, upon a signal releasing the voltage-controlled oscillator or its output.

If it is desired to operate the circuit arrangements according to the invention not only in start-stop mode but to carry on continuous operation, then the oscillator must be connected via the respective switch to the output of the calibrating device.

BRIEF DESCRIPTION OF THE DRAWINGS

To explain the invention, there is shown in.

DETAILED DESCRIPTION

Figure 1:
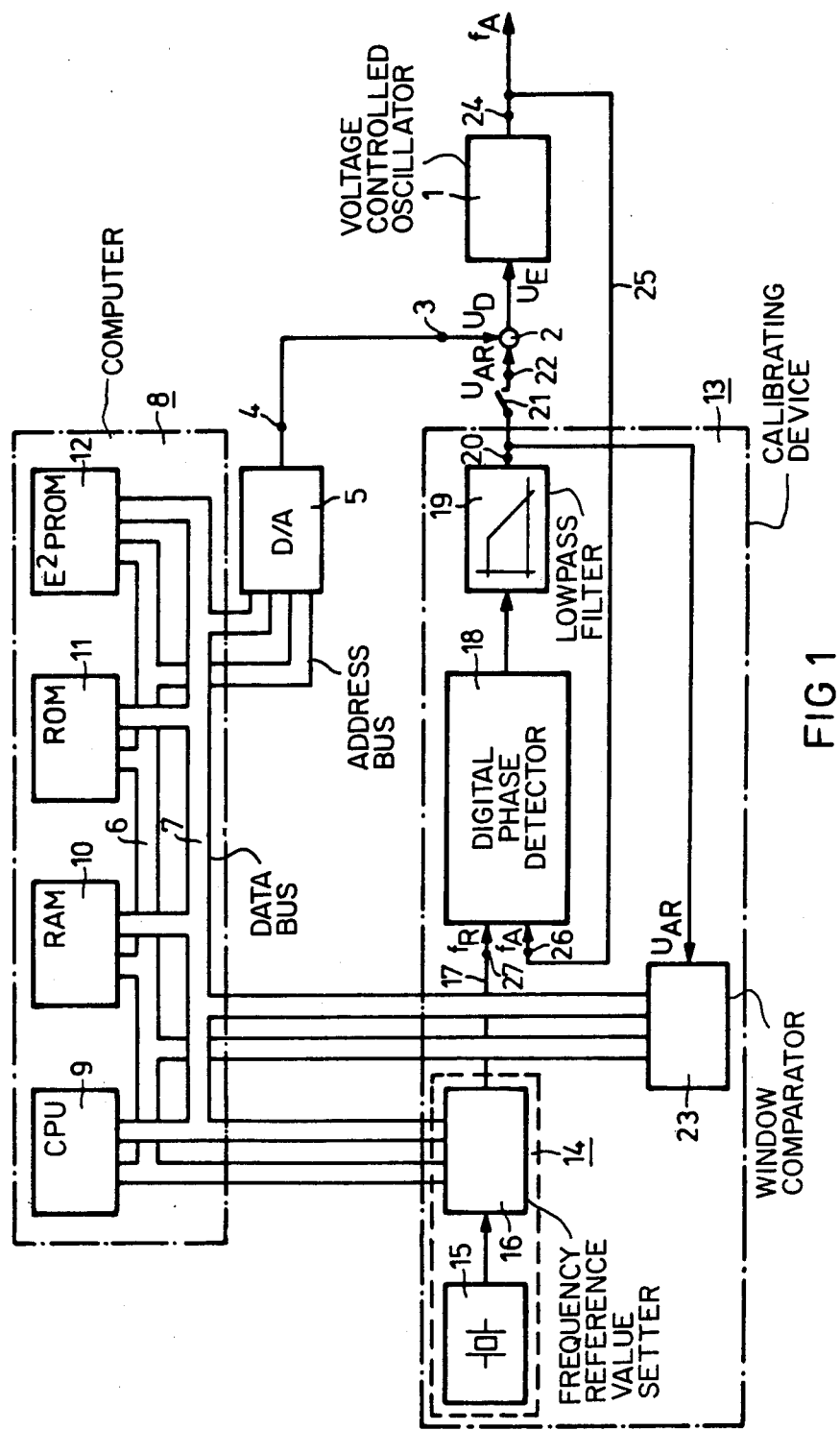
FIG. 1, an embodiment of a circuit arrangement for carrying out the method according to the invention with a calibrating device having a window comparator.

The circuit arrangement for carrying out the method according to the invention shown in FIG. 1 contains a voltage-controlled oscillator 1, which is preceded by an adding circuit 2. To one input 3 of the adding circuit 2, an output 4 of a digital-to-analog converter 5 is connected, which is connected on the input side to an address bus 6 as well as to a data bus 7 of a computer 8 and is, on the other hand, in communication with a digital phase detector 18 of a calibrating device 13 via a connecting line 17 from a frequency reference value setter 14. The phase detector 18, which can be designed as is described in the book by Tietze/Schenk on page 692, is followed by a lowpass 19, the output 20 of which is connected to an input 22 of the adding circuit 2 via a switch 21. In addition, the output 20 of the lowpass 19 is connected to a window comparator 23 which can be designed in a manner described on page 413 of the already mentioned book by Tietze/Schenk.

The window comparator 23 is connected on the output side likewise to the address bus 6 and the data bus 7 of the computer 8.

For constructing a phase-lock loop circuit arrangement, the output 24 of the voltage-controlled oscillator 1 is connected via a line 25 to one input 26 of the phase detector 18, to the further input 27 of which the connecting line 17 from the frequency reference value setter 14 is brought.

Referring to FIG. 1, the method according to the invention for calibrating an adjustable frequency generator will be described in the following.

In the closed condition of the switch 21, a reference frequency $f_R$ is set at the frequency reference setter 14, which is applied to the further input 27 of the phase detector 18 in the form of corresponding pulses. These pulses are compared with the pulses at the one input 26 of the phase detector 18, and a pulse is generated at the output of the phase detector 18, the pulse length of which is proportional to the respective phase difference. The pulses of the pulse sequence are integrated in the lowpass which consequently generates a voltage $U_{AR}$. Via the phase-locked loop circuit arrangement, a frequency $f_A$ is generated finally in a transient at the output 24 of the voltage-controlled oscillator 1 which is also present at the one input 26 of the phase detector 18. In the steady state, a voltage is generated at the output 20 of the lowpass 19 and therefore, as the input voltage $U_E$ at the input of the voltage-controlled oscillator 1 which causes the latter to deliver a voltage with the output frequency $f_A$ which corresponds exactly to the frequency $f_R$ at the further input 27 of the phase detector 18.

Subsequently, the computer 8, to which a digital reference value signal corresponding to the frequency $f_R$ has been fed by the frequency reference value setter 14, delivers an output voltage $U_D$ of a magnitude, for calibration, via the digital-to-analog converter to the input 3 of the adding circuit 2, which corresponds to the output voltage $U_{AR}$ of the lowpass 19. This is achieved by monitoring the output voltage of the lowpass 19 by the window comparator 23, in that the latter delivers, at a value zero of the output voltage $U_{AR}$ of the lowpass 19, a corresponding signal to the computer 8, whereby not only the voltage $U_D$ at the output 4 of the digital-to-analog converter 5 is held, but at the same time a digital value corresponding to this analog voltage is stored in the nonvolatile memory 12. Since at the same time the frequency $f_R$ of the frequency reference value setter 14 is stored in the computer 8, a given voltage value $U_D$ is therefore associated in digital form with the frequency $f_R$ in the computer 8

This process is run with different frequency reference values, so that, in the execution of the method according to the invention, a number of values is stored in the computer 8 which assign to a given frequency reference value a given output voltage at the digital-to-analog converter 5. Intermediate values can be determined by interpolation, if desired. Thereupon the entire calibrating device 13 can be disconnected from the computer 8 and the voltage-controlled oscillator 1, whereby an adjustable frequency generator is obtained which consists of the computer 8, the digital-to-analog converter 5 and the voltage-controlled oscillator 1. The adding circuit 2 can be omitted since the output 4 of the digital-to-analog converter 5 can be connected directly to the input of the voltage-controlled oscillator 1. In this manner, a frequency generator is then obtained which can operate in start-stop mode and thus generates a signal with the desired output frequency $f_A$ upon a frequency pre-selected at the computer 8 without transients at the output 24 of the voltage-controlled oscillator, where this signal also fulfills a certain starting condition, and therefore, also for instance, begins with a zero crossing from minus to plus.

If the calibrating device 13 is not disconnected from the other parts of the circuit arrangement of FIG. 1 after the calibration is completed, an adjustable frequency generator is obtained which works, with the switch 21 closed, in continuous operation and, with the switch 21 open, can be used in start-stop operation.

Figure 2:
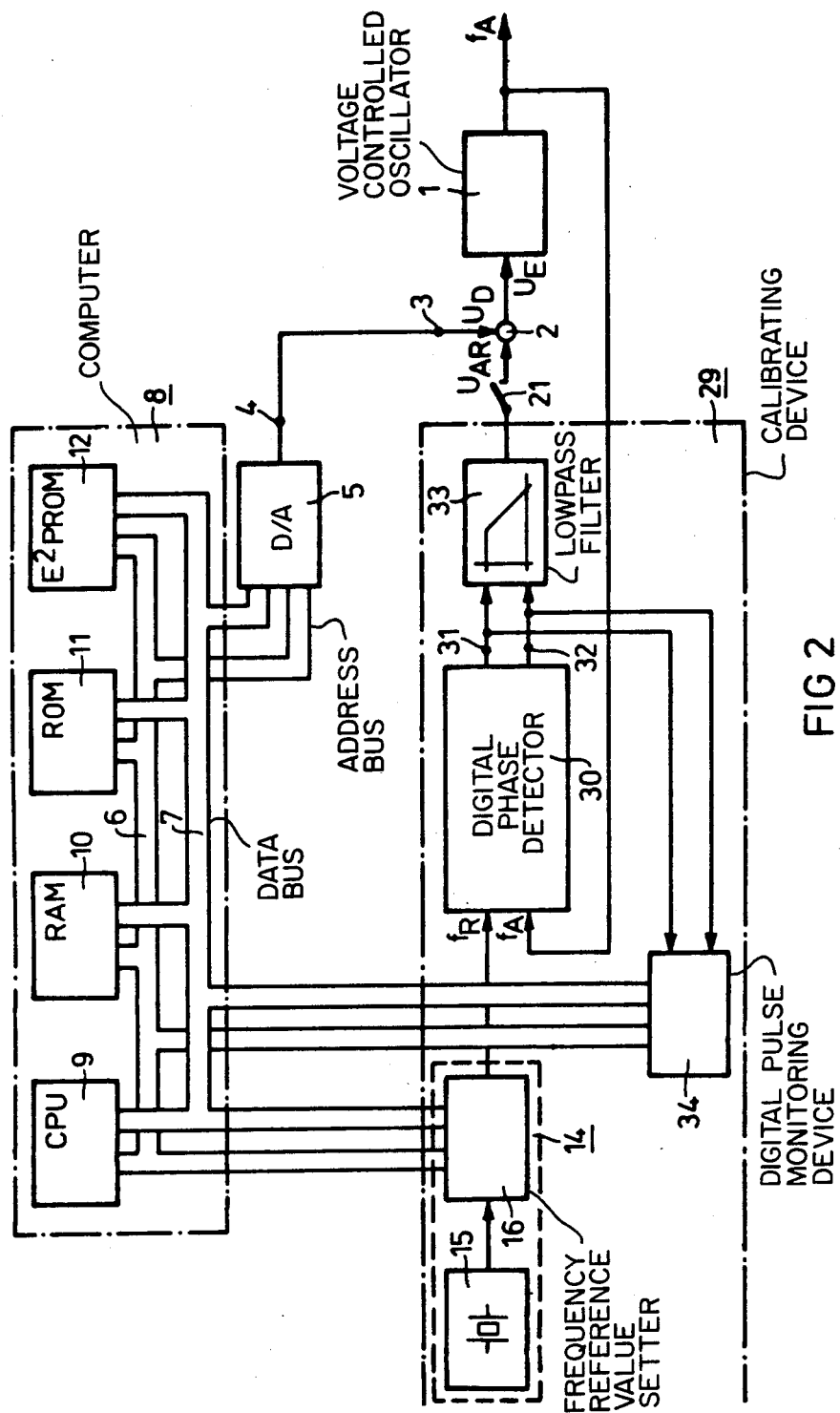
FIG. 2, a further embodiment of the circuit arrangement for carrying out the method according to the invention, with a calibrating device having a phase comparator with two outputs.

The circuit arrangement shown in FIG. 2 agrees in many parts with that according to FIG. 1, so that identical parts are designated in both figures with the same reference symbols. It is an important difference of the circuit arrangement according to FIG. 2 from the previously described one that it contains in a calibrating device 29 a phase detector 30 with two outputs, such as described, for instance, in the book by Roland Best "Theorie und Anwendungen des Phase-locked Loops," 3rd ed., 1982, page 16, last line. The phase detector 30 has two outputs 31 and 32 which are connected to a following lowpass 33 and also to a digital pulse-monitoring device 34. The digital pulse-monitoring device 34 is connected on the output side to the address bus 6 and the data bus 7 of the computer 8. The lowpass 33 is again connected via a switch 21 to an adding circuit 2 which is linked circuit-wise to the other building blocks exactly as in the circuit arrangement according to FIG. 1.

In constructing an adjustable frequency generator with the circuit arrangement according to FIG. 2, the procedure is similar to the circuit arrangement according to FIG. 1. Differing therefrom, it is only monitored by means of the digital pulse monitoring device 34 whether there are signals at the outputs 31 and 32 which have the same phase. If this is the case, the current calibrating process is considered finished, and a digital signal corresponding to the voltage $U_D$ at the input 3 of the adding circuit 2 is stored in the computer 8, related to the respective frequency reference value.

By disconnecting the calibrating device 29 from the computer 8 and the voltage-controlled oscillator 1, a frequency generator can then be obtained which can be used for start-stop operation. If the calibrating device 29 is not disconnected, a frequency generator is obtained which, depending on the position of the switch 21, can be used as a continuously operating frequency generator as well as a start-stop frequency generator.

Figure 3:
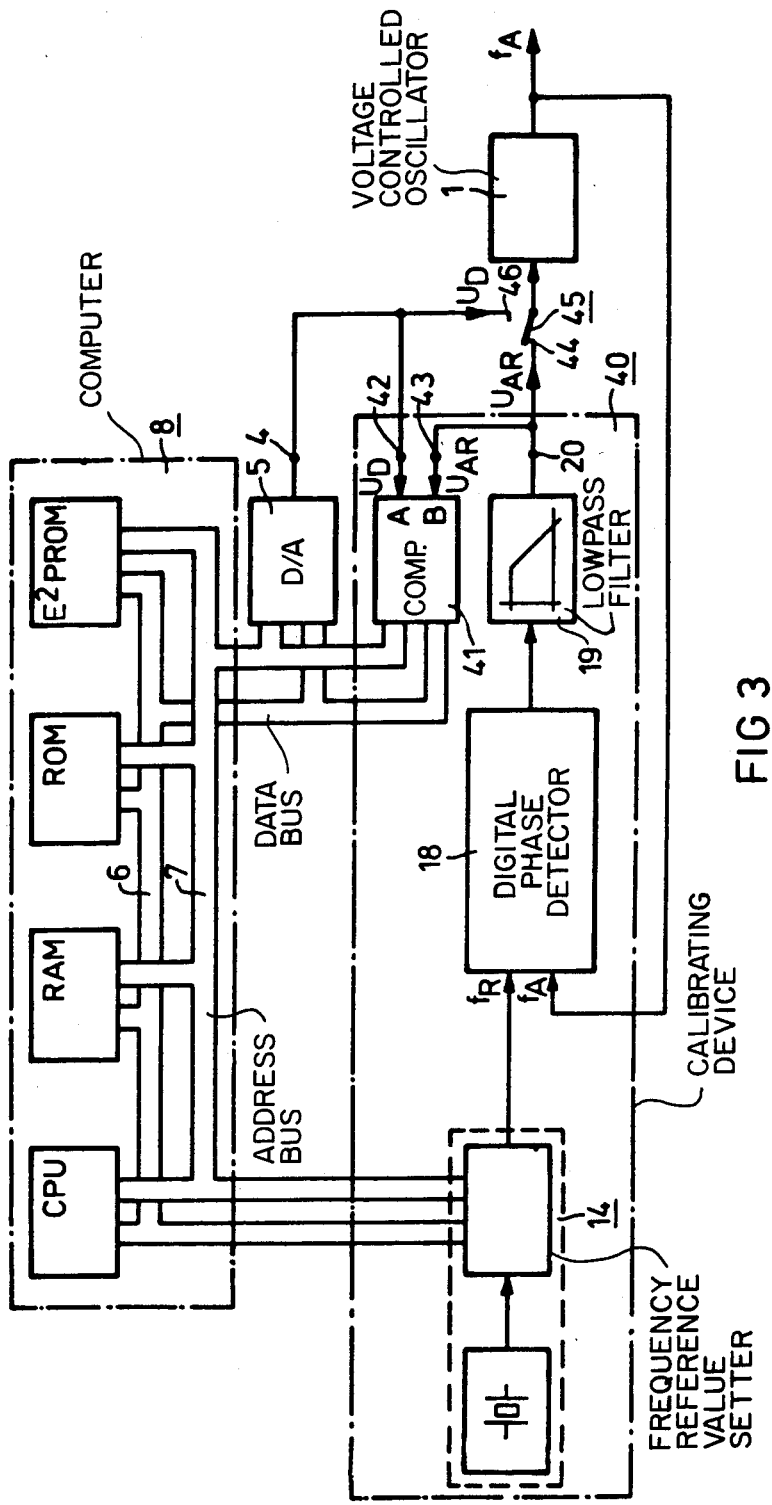
FIG. 3, an additional embodiment of the circuit arrangement according to the invention with a calibrating device and a comparator.

In the circuit arrangement according to FIG. 3, a calibrating device 40 contains, besides the frequency reference value setter 14, the phase detector 18 following the former and the lowpass 19, a comparator 41, one input 42 of which is connected to the output 4 of the digital-to-analog converter. A further input 43 of the comparator 41 is connected to the output 20 of the lowpass 19. The output 20 of the lowpass 19 is in addition connected to a contact 44 of a switch 45 which is connected to the voltage-controlled oscillator 1. A further contact 46 of the switch 45 is connected to the input 42 of the comparator 41 as well as to the output 4 of the digital-to-analog coverter 5. The comparator 41 is connected on the output side to the address bus 6 and the data bus 7 of the computer which is constructed in the same manner as shown in FIGS. 1 and 2.

The calibrating process runs, in the circuit arrangement according to FIG. 3, in such a manner that, upon a frequency value set by means of the frequency value setter, a voltage $U_D$ is generated by the computer 8 by means of the digital-to-analog converter 5, with the position of the switch 45 shown, which is exactly as large as the voltage $U_{AR}$ at the output of the lowpass 19. Equality of the voltages $U_D$ and $U_{AR}$ is determined by means of the comparator 41, which in the event of voltage equality, delivers at its output a signal to the computer 8, whereupon the just selected frequency reference value as well as, in digital form, also the voltage value $U_D$ is stored. This is again done for a number of frequency reference values.

If the calibration process is finished, the circuit arrangement shown can be used in start-stop operation by changing the switch 45 to the contact 46, where upon each preselected frequency value in the computer 8, an output frequency $f_A$ is formed immediately without any transients at the output of the voltage-controlled oscillator 1, which corresponds to the desired frequency. If the switch 45 is in the position shown, then the circuit arrangement shown can be used as a continuously operating frequency generator.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A method for calibrating an adjustable frequency generator having a voltage-controlled oscillator coupled to a computer via a digital-to-analog converter, the oscillator further being coupled to a calibrating device comprising a digital phase detector and a lowpass filter forming a phase-locked loop circuit arrangement, an output of the oscillator being coupled to one input of the phase detector, and a further input of the phase detector being coupled to an adjustable frequency reference value setter of the calibrating device, said method comprising the steps of supplying digital reference value signals corresponding to different frequency reference value signals to the computer and to the further input of the phase detector, causing the digital-to-analog converter under control of the computer to deliver at its output a control voltage to an input of the oscillator after a steady state of the phase-locked loop circuit arrangement is reached for the respective frequency reference value signal, said control voltage corresponding to an output voltage of the lowpass filter prior to the beginning of the calibrating process, storing a digital value corresponding to the control voltage associated with the respective digital reference value signal in the computer, and disconnecting the input of the oscillator from the calibrating device.

2. The method recited in claim 1, wherein the output of the digital-to-analog converter is coupled via an adding circuit to the input of the voltage-controlled oscillator and further comprising the steps of monitoring the output voltage of the lowpass filter for the value zero, and when the value zero is reached, generating a store command for the respective digital reference value signal and the digital value corresponding to the control voltage.

3. The method recited in claim 1, wherein the output of the digital-to-analog converter is coupled via an adding circuit to the input of the voltage-controlled oscillator, and the phase detector provides two output signals, and further comprising the steps of examining the two output signals for phase equality, and, in the event of phase equality, generating a store command for the digital reference value signal and the digital value corresponding to the control voltage.

4. The method recited in claim 1, wherein the output of the digital-to-analog converter is coupled to an unoccupied contact of a switch, the switch having a further occupied contact which couples the voltage-controlled oscillator to the lowpass filter and further comprising the steps of comparing in the steady-state condition the output voltage of the digital-to-analog converter with the output voltage of the lowpass filter and, in the event of phase equality of said output voltage of the digital-to-analog converter and the output voltage of said lowpass filter, generating a store command for the digital reference value signal and the digital value corresponding to the control voltage.

5. A circuit arrangement for calibrating an adjustable frequency generator having a voltage-controlled oscillator coupled to a computer via a digital-to-analog converter, the oscillator further being coupled to a calibrating device comprising a digital phase detector and a lowpass filter forming a phase-locked loop circuit arrangement, an output of the oscillator being coupled to one input of the phase detector, and a further input of the phase detector being coupled to an adjustable frequency reference value setter of the calibrating device, said setter comprising means for supplying digital reference value signals corresponding to different frequency reference value signals to the computer and to the further input of the phase detector, said digital-to-analog converter comprising means under control of the computer for delivering a control voltage at its output to an input of the oscillator after a steady state of the phase-locked loop circuit arrangement is reached for the respective frequency reference value signal, said control voltage corresponding to an output voltage of the lowpass filter prior to the beginning of the calibrating process, means for storing a digital value corresponding to the control voltage associated with the respective digital reference value signal in the computer, and means for disconnecting the input of the oscillator from the calibrating device, the output of the digital-to-analog converter being coupled via an adding circuit to the input of the voltage-controlled oscillator and further comprising means for monitoring the output voltage of the lowpass filter for a zero value, and, when the zero value is reached, for generating a store command for the respective digital reference value signal and the digital value corresponding to the control voltage, the frequency reference value setter being connected to an address bus and a data bus of the computer and to the further input of the phase detector, said voltage monitoring circuit of the calibrating device having an input coupled to the output of the lowpass filter, and an output coupled to the address bus and the data bus of the computer, the digital-to-analog converter having an input coupled to the address bus and to the data bus of the computer and an output coupled to the adding circuit.

6. A circuit arrangement for calibrating an adjustable frequency generator having a voltage-controlled oscillator coupled to a computer via a digital-to-analog converter, the oscillator further being coupled to a calibrating device comprising a digital phase detector and a lowpass filter forming a phase-locked loop circuit arrangement, an output of the oscillator being coupled to one input of the phase detector, and a further input of the phase detector being coupled to an adjustable frequency reference value setter of the calibrating device, said setter comprising means for supplying digital reference value signals corresponding to different frequency reference value signals to the computer and to the further input of the phase detector, said digital-to-analog converter comprising means under control of the computer for delivering a control voltage at its output to an input of the oscillator after a steady state of the phase-locked loop circuit arrangement is reached for the respective frequency reference value signal, said control voltage corresponding to an output voltage of the lowpass filter prior to the beginning of the calibrating process, means for storing a digital value corresponding to the control voltage associated with the respective digital reference value signal in the computer, and means for disconnecting the input of the oscillator from the calibrating device, the output of the digital-to-anlog converter being coupled via an adding circuit to the input of the voltage controlled oscillator, said phase detector having two outputs, and means for examining the two outputs for phase equality, and for generating, in the event of phase equality, a store command for the digital reference value signal and the digital value corresponding to the control voltage, the frequency reference value setter being coupled to an address bus and a data bus of the computer and to the further input of the phase detector, the two outputs of the phase detector being coupled to inputs of a digital pulse monitoring means of the calibrating device, said monitoring means having an output coupled to the address bus and the data bus, the digital-to-analog converter having an input coupled to the address bus and the data bus of the computer and an output coupled to the adding circuit.

7. The circuit arrangement recited in claim 5 wherein said means for disconnecting comprises a switch and the adding circuit is coupled via the switch to the output of the lowpass filter.

8. The circuit arrangement recited in claim 6 wherein said means for disconnecting comprises a switch and the adding circuit is coupled via the switch to the output of the lowpass filter.

9. A circuit arrangement for calibrating an adjustable frequency generator having a voltage-controlled oscillator coupled to a computer via a digital-to-analog converter, the oscillator further being coupled to a calibrating device comprising a digital phase detector and a lowpass filter forming a phase-locked loop circuit arrangement, an output of the oscillator being coupled to one input of the phase detector, and a further input of the phase detector being coupled to an adjustable frequency reference value setter of the calibrating device, said setter comprising means for supplying digital reference value signals corresponding to different frequency reference value signals to the computer and to the further input of the phase detector, said digital-to-analog converter comprising means under control of the computer for delivering a control voltage at its output to an input of the oscillator after a steady state of the phase-locked loop circuit arrangement is reached for the respective frequency reference value signal, said control voltage corresponding to the output voltage of the lowpass filter prior to the beginning of the calibrating process, means for storing a digital value corresponding to the control voltage associated with the respective digital reference value signal in the computer, and means for disconnecting the input of the oscillator from the calibrating device, the output of the digital-to-analog converter being coupled to an unoccupied contact of a switch, the switch having a further occupied contact which couples the voltage-controlled oscillator to the lowpass filter and further comprising means for comparing in the steady-state condition the output voltage of the digital-to-analog converter with the output voltage of the lowpass filter and, in the event of equality of said output signals, for generating a store command for the digital reference value signal and the digital value corresponding to the control voltage, the frequency reference value setter being coupled to an address bus and a data bus of the computer and to the further input of the phase detector, the digital-to-analog converter having an input coupled to the address bus and the data bus of the computer and an output coupled via the switch to an input of the oscillator, said means for comparing having an input coupled to an output of the digital-to-analog converter and an input coupled to an output of the lowpass filter and an output coupled to the address bus and data bus of the computer.

10. The circuit arrangement recited in claim 9, wherein said means for disconnecting comprises a switch and the oscillator is coupled via the switch to the output of the lowpass filter.

* * * * *